(12) United States Patent
Ishigaki et al.

(10) Patent No.: US 8,183,115 B2
(45) Date of Patent: May 22, 2012

(54) METHOD OF MANUFACTURING A SEMICONDUCTOR DEVICE HAVING ELEVATED LAYERS OF DIFFERING THICKNESS

(75) Inventors: Takashi Ishigaki, Hino (JP); Ryuta Tsuchiya, Tokyo (JP); Yusuke Morita, Amagasaki (JP); Nobuyuki Sugii, Tokyo (JP); Shinichiro Kimura, Kunitachi (JP); Toshiaki Iwamatsu, Toyonaka (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/088,020

(22) Filed: Apr. 15, 2011

(65) Prior Publication Data

US 2011/0195566 A1    Aug. 11, 2011

Related U.S. Application Data

(63) Continuation of application No. 12/248,250, filed on Oct. 9, 2008, now abandoned.

(30) Foreign Application Priority Data

Oct. 11, 2007    (JP) ................................ 2007-265037

(51) Int. Cl.
*H01L 21/8234* (2006.01)

(52) U.S. Cl. .. 438/275; 438/300; 257/368; 257/E21.616
(58) Field of Classification Search .......................... None
See application file for complete search history.

(56) References Cited

U.S. PATENT DOCUMENTS

| 5,869,872 A | 2/1999 | Asai et al. |
| 6,303,450 B1 | 10/2001 | Park et al. |
| 7,176,110 B2 | 2/2007 | van Bentum et al. |
| 7,459,382 B2 | 12/2008 | Amos et al. |
| 7,633,127 B2 | 12/2009 | Wen et al. |
| 2003/0111688 A1* | 6/2003 | Hokazono et al. ............ 257/335 |

(Continued)

FOREIGN PATENT DOCUMENTS

JP    08-102498    4/1996
(Continued)

OTHER PUBLICATIONS

"Novel 20nm Hybrid SOI/Bulk CMOS Technology with 0.183µm2 6T-STRAM Cell by Immersion Lithography" by Hou Yu Chen, et al. 2005 Symposium on VLSI.

(Continued)

*Primary Examiner* — Evan Pert
*Assistant Examiner* — Andres Munoz
(74) *Attorney, Agent, or Firm* — Mattingly & Malur, PC

(57) ABSTRACT

There is provided an SOI-MISFET including: an SOI layer; a gate electrode provided on the SOI layer interposing a gate insulator; and a first elevated layer provided higher in height from the SOI layer than the gate electrode at both sidewall sides of the gate electrode on the SOI layer so as to constitute a source and drain. Further, there is also provided a bulk-MISFET including: a gate electrode provided on a silicon substrate interposing a gate insulator thicker than the gate insulator of the SOI MISFET; and a second elevated layer configuring a source and drain provided on a semiconductor substrate at both sidewalls of the gate electrode. The first elevated layer is thicker than the second elevated layer, and the whole of the gate electrodes, part of the source and drain of the SOI-MISFET, and part of the source and drain of the bulk-MISFET are silicided.

8 Claims, 16 Drawing Sheets

U.S. PATENT DOCUMENTS

| | | |
|---|---|---|
| 2009/0072312 A1 | 3/2009 | Chang et al. |
| 2010/0084709 A1 | 4/2010 | Tsuchiya et al. |

FOREIGN PATENT DOCUMENTS

| | | |
|---|---|---|
| JP | 2003-110109 | 4/2003 |
| JP | 2007-004535 | 1/2007 |

OTHER PUBLICATIONS

Technology Digest of Technical Papers, pp. 16-17.

Tsuchiya et al, WO 2007-004535 A1, Jan. 2007, Machine translation.

\* cited by examiner

METHOD OF MANUFACTURING A SEMICONDUCTOR DEVICE HAVING ELEVATED LAYERS OF DIFFERING THICKNESS

CROSS-REFERENCE TO RELATED APPLICATIONS

This application is a continuation application of U.S. Ser. No. 12/248,250, filed Oct. 9, 2008 now abandoned, the entire contents of which are hereby incorporated by reference.

The present application claims priority from Japanese Patent Application No. JP 2007-265037 filed on Oct. 11, 2007, the content of which is hereby incorporated by reference into this application.

TECHNICAL FIELD OF THE INVENTION

The present invention relates to a semiconductor device and a manufacturing technology thereof. More particularly, the present invention relates to a MISFET (Metal Insulator Semiconductor Field Effect Transistor) formed on a substrate (SOI substrate) having an SOI (Silicon on Insulator) structure.

BACKGROUND OF THE INVENTION

Accompanying the introduction of higher integration and higher performance of LSIs (semiconductor devices), the miniaturization of a MISFET constituting an LSI has been advanced. As a gate length of the MISFET is scaled, a problem of short channel effect that reduces a threshold voltage Vth has become significant. This short channel effect arises from the fact that the broadening of depletion layers of the source and drain portions of the MISFET affects up to a channel portion along with the miniaturization of the channel length.

However, in recent years, a full depletion type SOI structure has been attracting attentions. In this structure, the depletion layer induced in a body region directly below a gate electrode reaches up to the bottom of the body region, that is, an interface of the body region and a buried insulating layer, and thus a steep sub-threshold factor (S-factor) is obtained. In general, with respect to an element having a gate length smaller than or equal to 100 nm, a thin single-crystal semiconductor layer (SOI layer) on the buried insulating layer is required to be smaller than or equal to 20 nm.

At this time, since a diffusion layer (semiconductor region) constituting the source and drain is also formed inside the thin SOI layer, an external resistance of the MISFET becomes high. Further, when a silicide layer is formed on an upper portion of the diffusion layer to reduce the resistance, a silicide layer reaches up to the buried insulating layer, and this reduces a contact area between the diffusion layer and the silicide layer, and a problem arises that a contact resistance is increased and a current is reduced.

To avoid these problems, it is conceivable to form a so-called elevated source and drain structure (hereinafter, the stacked semiconductor layers are referred to as an elevated layer), which constitutes the source and drain by the semiconductor layers elevated at both sides of the gate (gate electrode). This is because, by elevating, that is, stacking semiconductor layers on the SOI layer serving as a base by using a selective epitaxial growth method, the silicide layer is prevented from reaching up to the buried insulating layer and the external resistance of the MISFET can be reduced.

Meanwhile, since a breakdown voltage between source and drain of the MISFET fabricated on the SOI substrate is deteriorated, there arises a problem that it can be used only in a low voltage regime. Hence, it is desirable that a high-breakdown voltage element (for example, MISFET), and an ESD (electrostatic breakdown) protection element and the like for preventing ESD are fabricated not on the SOI substrate, but on a bulk substrate.

In Hou-Yu Chen et al., "Novel 20 nm Hybrid SOI/Bulk CMOS Technology with 0.183 $\mu m^2$ 6T-SRAM Cell by Immersion Lithography", 2005 Symposium on VLSI Technology Digest of Technical Papers, 2005, pp. 16-17 (Non-Patent Document 1), the SOI layer and the elevated insulating layer of the SOI substrate are removed, so that a bulk region whose silicon substrate is exposed on the same substrate is formed. As a result, by using the SOI substrate having an extremely thin buried insulating layer having a 20-nm thickness so that a step between the bulk region and the SOI region is made low, the SOI region can be formed with the MISFET (hereinafter, referred to as SOI-MISFET) and the bulk region can be formed with the MISFET (hereinafter, referred to as bulk-MISFET) by a common process without further complication.

SUMMARY OF THE INVENTION

When the SOI-MISFET and the bulk-MISFET have an elevated source and drain structure (elevated layer), it is desirable that the thickness of the elevated layer is suitable to each of the SOI-MISFET and the bulk-MISFET. The reason is because the conditions of impurity implantation for forming a diffusion layer are adjusted by the thickness of the elevated layer. Further, to avoid a problem of gate depletion in the MISFET using polycrystalline (poly-) silicon for the gate, when a full silicidation processing (FUSI) is performed for fully siliciding the polycrystalline silicon of the gate up to the gate insulator, it is necessary to avoid the gate and the source or the drain from contacting with each other at the time of silicidation.

The inventors of the present invention have conducted a study on the semiconductor device having an SOI-MISFET and a bulk-MISFET mounted together. For example, similarly to the Non-Patent Document 1, when the SOI-MISFET and the bulk-MISFET are formed by a same process, a step of forming an elevated layer on both of the SOI-MISFET and the bulk-MISFET by selective epitaxial growth is conceivable. In the course of such a study, the present inventors have found out a phenomenon that the thickness of the elevated layer is varied depending on a concentration of an impurity contained in the single crystal silicon serving as a base in the selective epitaxial growth. Specifically, it was found that the lower the impurity concentration is, the thicker the elevated layer becomes.

Due to this phenomenon, after simply forming the elevated layers on both of the SOI-MISFET and the bulk-MISFET by the selective epitaxial growth, when the full silicidation processing is performed for fully siliciding the polycrystalline polysilicon of the gate up to the gate insulator, there is a problem as described below.

When the gate and the source/drain are silicided at the same time, it is necessary to elevate the elevated layer of the SOI-MISFET higher than the gate so that the silicide layer of the SOI-MISFET formed on the SOI layer does not reach the buried insulating layer. Further, in the bulk-MISFET formed on the bulk (semiconductor substrate) of a high-breakdown voltage element and the like, to increase a breakdown voltage between the source and drain, the base (single crystal silicon)

of the elevated layer of the bulk-MISFET has an impurity concentration of approximately $5\times10^{17}/cm^3$ to $1\times10^{19}/cm^3$. In the meantime, in the base (single crystal silicon) of the elevated layer of the SOI-MISFET, because of the reduction of the external resistance, an impurity concentration thereof is about $1\times10^{19}/cm^3$ or more, which is higher than that of the bulk-MISFET.

In such a case, when the elevated layers of the SOI-MISFET and the bulk-MISFET are formed simultaneously, due to the phenomenon found out by the present inventors, even when the height of the elevated layer of one SOI-MISFET is appropriately adjusted, the elevated layer of the bulk-MISFET becomes too high in the other bulk-MISFET, because the impurity concentration of the semiconductor region (single crystal silicon) of the base is low.

When the elevated layer of the bulk-MISFET becomes too high in this manner, on the occasion of forming the diffusion layer by the bulk-MISFET and the SOI-MISFET thereafter, it becomes necessary to adjust the conditions of the impurity implantation, and thus the process becomes complicated. Further, when the elevated layer of the bulk-MISFET becomes too high compared to a gate sidewall, the gate is sometimes connected to the source or drain at the time of silicidation.

Therefore, as mentioned above, it is desirable that the thickness of the elevated layer is suitable to each of the SOI-MISFET and the bulk-MISFET.

An object of the present invention is to provide a technology capable of realizing higher integration and higher performance of a semiconductor device.

Another object of the present invention is to provide a technology capable of manufacturing a semiconductor device provided with an SOI-MISFET and a bulk-MISFET on the same semiconductor substrate.

The above and other objects and novel characteristics of the present invention will be apparent from the description of this specification and the accompanying drawings.

The typical ones of the inventions disclosed in this application will be briefly described as follows.

A semiconductor device according to one embodiment of the present invention has: a semiconductor substrate having an SOI region and a bulk region in a periphery of the SOI region; an SOI-MISFET provided in the SOI region; and a bulk-MISFET provided in the bulk-region having a breakdown voltage higher than that of the SOI-MISFET.

The SOI-MISFET includes: an SOI layer provided on an insulating layer buried in the semiconductor substrate; a first gate electrode provided on the SOI layer interposing a first gate insulator; and a first elevated layer provided on the SOI-layer at both sidewall sides of the first gate electrode and having a height from the SOI layer larger than that of the first gate electrode to constitute a first source and drain.

Further, the bulk-MISFET includes: a second gate electrode provided on the semiconductor substrate interposing a second gate insulator thicker than the first gate insulator; and a second elevated layer forming a second source and drain provided on the semiconductor substrate at both sidewall sides of the second gate electrode.

Here, a thickness of the first elevated layer is larger than that of the second elevated layer, and the whole of the first gate electrode and the second gate electrode are silicided, and parts of the first source and drain and the second source and drain are silicided.

The effects obtained by typical aspects of the present invention will be briefly described below.

According to one embodiment, the thicknesses of the first elevated layer and the second elevated layer are optimized, and the semiconductor device having the SOI-MISFET and the bulk-MISFET mounted together can be highly integrated and highly improved in performance.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Also, components having the same function are denoted by the same reference symbols throughout the drawings for describing the embodiments, and the repetitive description thereof is omitted.

Hereinafter, embodiments of the present invention will be described in detail with reference to the accompanying drawings. It is needless to say that materials, types of conductivity, and conditions in manufacturing are not limited to those described in the embodiments, and there are many various modifications, respectively.

First Embodiment

Figure 1:
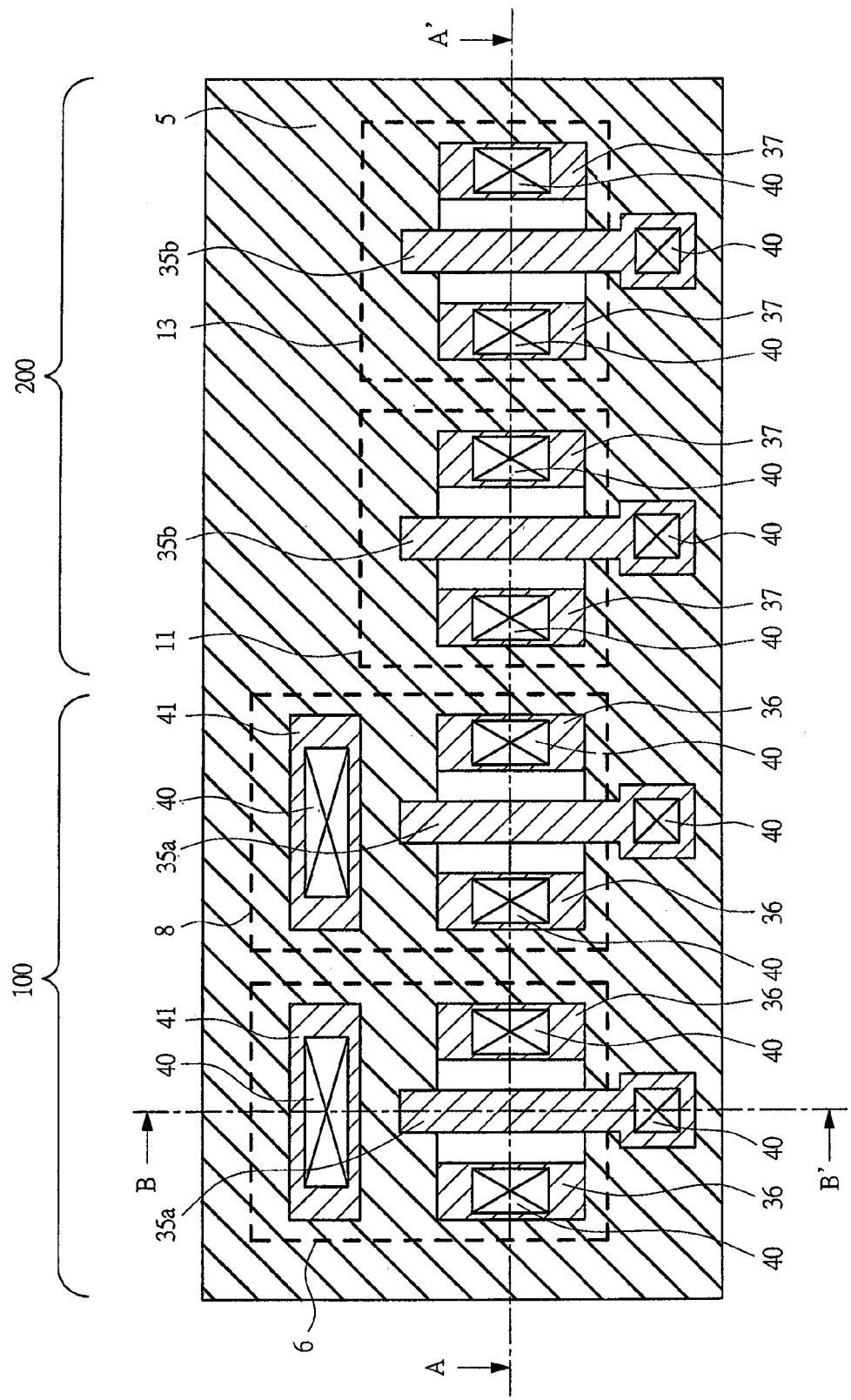
FIG. 1 is a planar view of main parts showing a semiconductor device according to one embodiment of the present invention.
Figure 2:
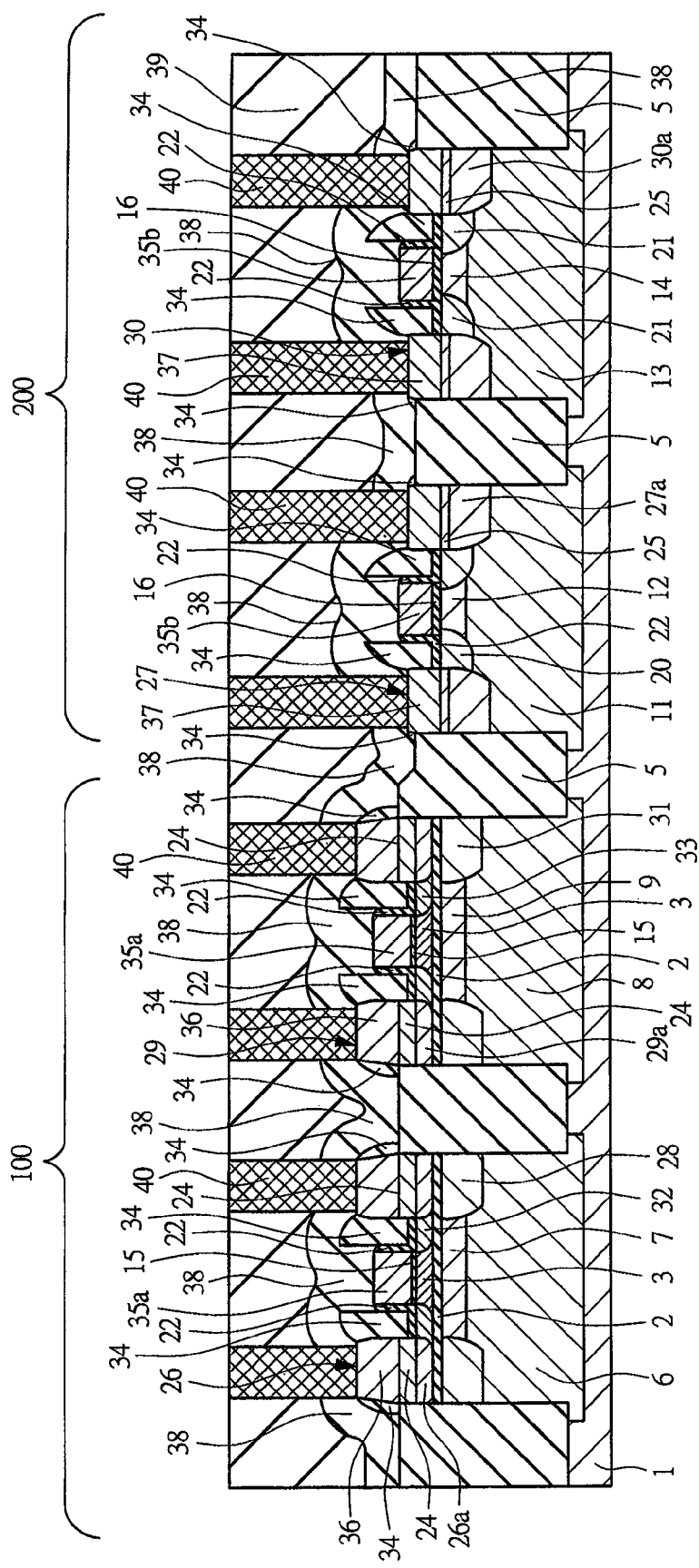
FIG. 2 is a cross-sectional view of main parts of a semiconductor substrate taken along the line A-A' of FIG. 1.
Figure 3:
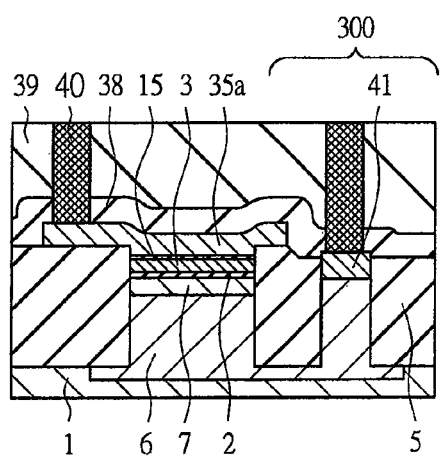
FIG. 3 is a cross-sectional view of main parts of the semiconductor substrate taken along the line B-B' of FIG. 1.

In FIGS. 1 to 3, a semiconductor device according to an embodiment of the present invention is shown. FIG. 1 is a planar view of main parts, FIG. 2 is a cross-sectional view of main parts taken along the line A-A' of FIG. 1, and FIG. 3 is a cross-sectional view of main parts taken along the line B-B' of FIG. 1. In the planar view of FIG. 1, to facilitate visualization, illustrations of part of members such as an insulating film (insulator) are omitted.

The semiconductor device of the present embodiment includes: an SOI-MISFET having a gate electrode 35a that is fully silicided and an elevated source and drain structure inside an SOI region 100 of a silicon substrate 1; and a bulk-MISFET (high-breakdown voltage MISFET) having a gate electrode 35b that is fully silicided and an elevated source and drain structure inside a bulk region 200 on the silicon substrate 1 that is exposed by removing an SOI layer 3 and a buried insulating layer 2.

In this manner, the semiconductor device of the present embodiment includes: a silicon substrate 1 having an SOI region 100 and a peripheral region of the SOI region; the SOI-MISFET provided on an main surface of the silicon substrate 1 in the SOI region 100; and the bulk-MISFET provided on the main surface of the silicon substrate 1 in the bulk-region 200 and having a higher breakdown voltage than the SOI-MISFET.

In the SOI-MISFET inside the SOI region 100, the gate electrode 35a is formed on the silicon substrate 1, the buried insulating layer 2, and an SOI layer 3, interposing a gate insulator 15. In this manner, the SOI-MISFET includes the SOI layer 3 on the buried insulating layer 2 buried in the silicon substrate 1, and the gate electrode 35a provided on the SOI layer 3 interposing the gate insulator 15.

Further, the SOI-MISFET includes: a channel region formed in the SOI layer 3 directly under the gate electrode 35a; a semiconductor region (diffusion layer) 26a or 29a constituting the source and the drain (diffusion layer 26 or 29) formed in the SOI layer 3 on both sides of the channel region, and an extension layer (diffusion layer) 32 or 33 formed in the SOI layer 3 between the semiconductor region 26a or 29a and the channel region.

Further, the SOI-MISFET includes: a sidewall 34 made of an insulating film formed at a side portion of the gate electrode 35a; an offset spacer formed of a silicon oxide film 22 formed between this sidewall 34 and the gate electrode 35a; an elevated layer 24 formed of a single crystal semiconductor layer formed on the SOI layer 3 (semiconductor region 26a or 29a), and a silicide layer 36 formed to the elevated layer 24. This elevated layer 24 constitutes the source and drain (diffusion layer 26 or 29) of the SOI-MISFET, and at this time, it becomes a layer in which an implanted impurity is diffused (diffusion layer). In this manner, among the elevated layer 24 and the semiconductor region 26a or 29a constituting the source and drain (diffusion layer 26 or 29) of the SOI-MISFET, an upper portion of the elevated layer 24 is silicided. Note that, if the SOI layer 3 below the elevated layer 24 is not silicided, the elevated layer 24 may be fully silicided.

Further, the SOI-MISFET includes a back gate contact electrode 41 for modulating the channel via a well 6 or 8 and the buried insulating layer 2 inside a back gate contact region 300 which similarly exposes the silicon substrate 1 inside the well 6 or 8.

In the bulk-MISFET inside the bulk region 200, a gate electrode 35b is formed on the same silicon substrate 1 to which the SOI-MISFET is formed interposing a gate insulator 16. The gate insulator 16 here is thicker in thickness than the gate insulator 15 of the SOI-MISFET. In this manner, the gate electrode 35b provided on the silicon substrate 1 through the gate insulator 16 thicker than the gate insulator 15 is provided.

Further, the bulk-MISFET includes: a channel region formed in the silicon substrate 1 directly under this gate electrode 35b; a semiconductor region 27a or 30a constituting the source and drain (diffusion layer 27 or 30) formed on the silicon substrate 1 at both sides of this channel region; and an extension layer (diffusion layer) 20 or 21 formed on the silicon substrate 1 between this semiconductor region 27a or 30a and the channel region.

Further, the bulk-MISFET includes: the sidewall 34 formed of an insulating film formed at the side portion of the gate electrode 35b; an offset spacer formed of the silicon oxide film 22 formed between this sidewall 34 and the gate electrode 35b; an elevated layer 25 formed of a single crystal semiconductor layer formed on this silicon substrate 1 (semiconductor region 27a or 30a); and a silicide layer 37 formed to the elevated layer 25. This elevated layer 25 constitutes the source and drain (diffusion layer 27 or 30) of the bulk-MISFET, and at this time, it becomes a layer in which an implanted impurity is diffused (diffusion layer). In this manner, among the elevated layer 25 and the semiconductor region 27a or 30a constituting the source and drain (diffusion layer 27 or 30) of the bulk-MISFET, whole of the elevated layer 25 and the upper portion of the semiconductor region 27a or 30a are silicided.

Further, whole of the gate electrodes 35a and 35b are constituted by fully silicided layers (silicide layers). Hence, a desired threshold voltage value is realized by the work function of the silicide layer. That is, a suppression of the gate depletion which causes a trouble in the gate electrode made of polycrystalline silicon, and a low resistance of gate electrode wiring is made possible. In the semiconductor device based on the present embodiment, while the descriptions will be made on a gate electrode material applied with a Ni silicide film, it is not limited to this, and the material may be one whose work function is positioned approximately on the center of a bandgap of a single crystal silicon thin film, among a metal film, a metal silicided film or a metal nitride film of Ni, Co, Ti, W, Ta, Mo, Cr, Al, Pt, Pa, and Ru, etc.

Further, in the semiconductor device according to the present embodiment, a thickness of the elevated layer 24 of the SOI-MISFET is made thicker than that of the elevated layer 25 of the bulk-MISFET, and part of the source and drain (diffusion layer 26 or 29) of the SOI-MISFET and the source and drain (diffusion layer 27 or 30) of the bulk-MISFET are silicided.

Here, the SOI-MISFET in the present embodiment has the elevated layer 24 on the SOI layer 3 constituting the channel and extremely thin having a thickness of, for example, about 10 nm. Most part of the source and drain (diffusion layer 26 or 29) of the SOI-MISFET including the elevated layer 24 is constituted by the silicide layer 36, and moreover, the silicide layer 36 is constituted so as not to reach the buried insulating layer 2. Hence, without increasing the contact resistance of the silicide layer 36 and the diffusion layer 26 or 29, an external resistance of the SOI-MISFET is reduced, and a drive current can be increased.

Further, the bulk-MISFET has the elevated layer 25 having a smaller thickness than the elevated layer 24 of the SOI-MISFET. Hence, the diffusion layer 27 or 30 formed by the same process as the SOI-MISFET can be formed deeply into the silicon substrate 1, and moreover, formed with an impurity concentration distribution moderate from the upper surface. This can realize a resistance reduction of the diffusion layer 27 or 30 and reduction of a leakage current flowing through a PN junction between the diffusion layer 27 or 30 and the silicon substrate 1 at the same time. Further, since the silicide layer 37 can be formed from the elevated layer 25 constituting the source and drain (diffusion layer 27 or 30) of the bulk-MISFET into the silicon substrate 1 (semiconductor region 27a or 30a), the contact area of the silicide layer 37 with the diffusion layer 27 or 30 can be increased so that the contact resistance is reduced.

Further, in the present embodiment, a high-performance SOI-MISFET and a bulk-MISFET such as a high-breakdown voltage element and an ESD protection element for protecting ESD breakdown (electrostatic breakdown) can be manufactured on the same substrate without complicating the process.

In the present embodiment, a substrate (SOI-substrate) having a Full Depletion SOI structure is used. In this SOI substrate, the thickness of the buried insulating layer 2 is smaller than or equal to 20 nm, and the thickness of the SOI layer 3 is smaller than or equal to 20 nm. By using this SOI substrate, in the SOI-MISFET, a depletion layer induced in a body region directly below the gate electrode 35a reaches up to the bottom of the body region, that is, the boundary with the buried insulating layer 2, and therefore, a steep sub-threshold factor (S-factor) can be obtained.

In this manner, according to the present embodiment, the thicknesses of the elevated layer 24 of the SOI-MISFET and the elevated layer 25 of the bulk-MISFET are optimized, so that the semiconductor device having the SOI-MISFET and the bulk-MISFET mounted together can be highly integrated and highly improved in performance.

Next, an example of a method of manufacturing the semiconductor device in the present embodiment as configured according to the foregoing will be described in an order of steps by using the drawings. While descriptions will be made by fixing a semiconductor substrate and a conductive type of the semiconductor film, the combination of the conductive type may be arbitrary, and is not limited to the conductive type described in the present embodiment.

Figure 4:
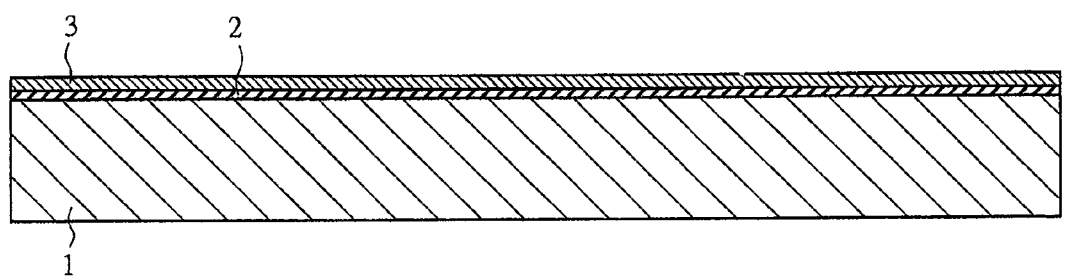
FIG. 4 is a cross-sectional view of main parts of the semiconductor substrate in a manufacturing step of the semiconductor device according to one embodiment of the present invention.

First, as shown in FIG. 4, a substrate (hereinafter, referred to as SOI substrate) is prepared, which has an SOI structure constituted by a semiconductor substrate, for example, the silicon substrate 1 of a P-type single crystal, the buried insulating layer 2 having a thickness of 10 nm buried in the silicon substrate 1, and the SOI layer 3 serving as a single crystal semiconductor layer having a thickness of 10 nm on the buried insulating layer 2. The SOI layer 3 can be made thin up to a desired thickness of about 10 nm after forming a silicon oxide film on the layer by, for example, a thermal oxidation method, and removing the silicon oxide film. In the present embodiment, the SOI substrate having a Full Depletion SOI structure is used to obtain a steep sub-threshold factor (S-factor).

Figure 5:
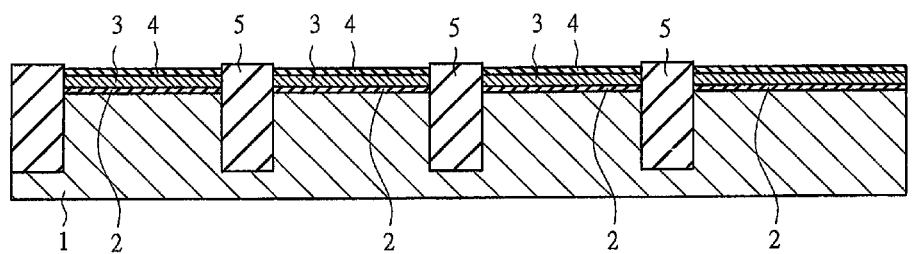
FIG. 5 is a cross-sectional view of main parts of the semiconductor substrate in a manufacturing step of the semiconductor device continued from FIG. 4.

Subsequently, as shown in FIG. 5, a silicon oxide film 4 is formed on the SOI layer 3, and a device isolation region 5 is formed on the SOI substrate. More specifically, the thin silicon oxide film 4 having a thickness of about 10 nm is first formed on the SOI layer 3 by, for example, a thermal oxidation method, and after that, a silicon nitride film is deposited by, for example, a CVD (Chemical Vapor Deposition) method. Next, by lithography technology and dry etching technology, a pattern (trench) is formed, where the silicon nitride film, the silicon oxide film 4, the SOI layer 3, the buried insulating layer 2, and a part (depth of 260 nm) of the silicon substrate 1 in the desired region are removed. Next, a thick silicon oxide film is deposited on the whole surface by, for example, the CVD method by a thickness to the extent that the patterned region (trench) is buried, and with taking the previously deposited silicon nitride film as a terminal point, the deposited silicon oxide film is planarized by a chemical mechanical polishing (CMP) method. Next, the silicon nitride film used as the terminal point of the CMP is selectively removed by, for example, hot phosphoric acid, so that the device isolation region 5 which is an STI (Shallow Trench Isolation) is formed. At this time, before removing the silicon nitride film, a part of the upper part of the planarized silicon oxide film is selectively removed by, for example, hydrofluoric acid cleaning, and thus the thickness of the silicon oxide film buried in the pattern (trench) can be adjusted and a step between the device isolation region 5 and the SOI layer 3 can be also controlled.

Figure 6:
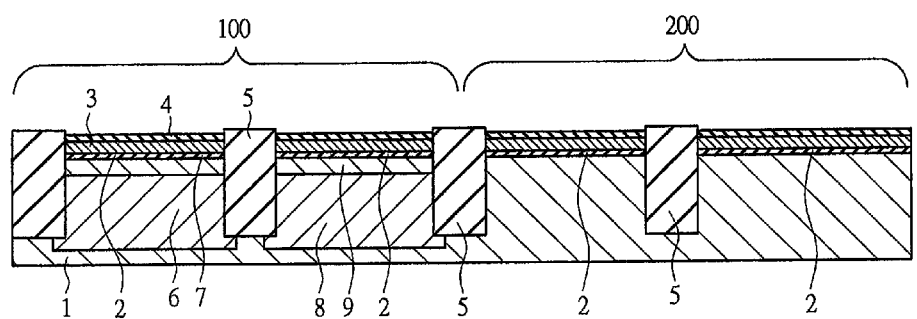
FIG. 6 is a cross-sectional view of main parts of the semiconductor substrate in a manufacturing step of the semiconductor device continued from FIG. 5.

Subsequently, as shown in FIG. 6, in the SOI region 100 forming the SOI-MISFET, the desired region of the silicon substrate 1 is selectively formed with the P-type well 6 and a threshold voltage control diffusion layer region 7 by ion implantation through the thin silicon oxide film 4, the thin SOI layer 3 and the thin buried insulating layer 2 by using a lithography technology. Subsequently, similarly, the desired region of the silicon substrate 1 is selectively formed with the N-type well 8 and a threshold voltage control diffusion layer region 9.

Figure 7:
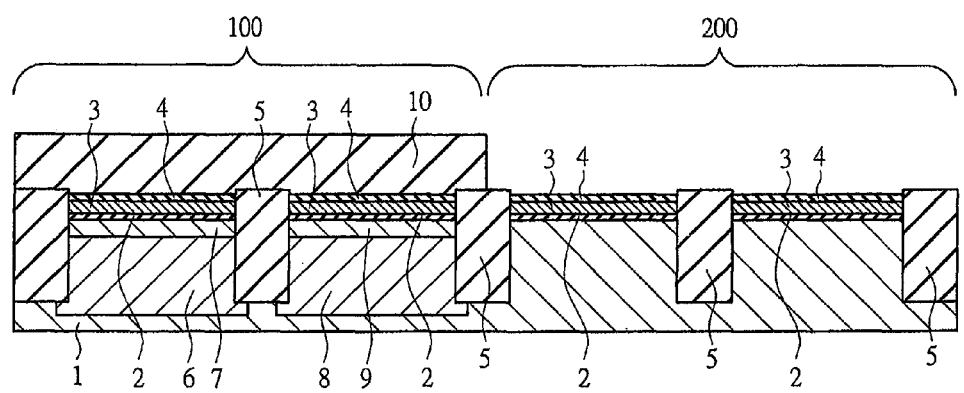
FIG. 7 is a cross-sectional view of main parts of the semiconductor substrate in a manufacturing step of the semiconductor device continued from FIG. 6.

Subsequently, as shown in FIG. 7, in the SOI region 100 for forming the SOI-MISFET, a photoresist pattern 10 is formed. More specifically, a photoresist is coated on the SOI substrate, and by the lithography technology, a photoresist pattern 10 is formed so as to form the bulk region 200 for forming the bulk-MISFET and to open a back gate contact region 300 for forming a back gate contact. At this time, the photoresist pattern 10 is formed so as to stretch to the device isolation region 5 of the boundary of the SOI region 100 and the bulk region 200, and the device isolation region 5 of the boundary of the SOI region 100 and the back gate contact region 300.

Figure 8:
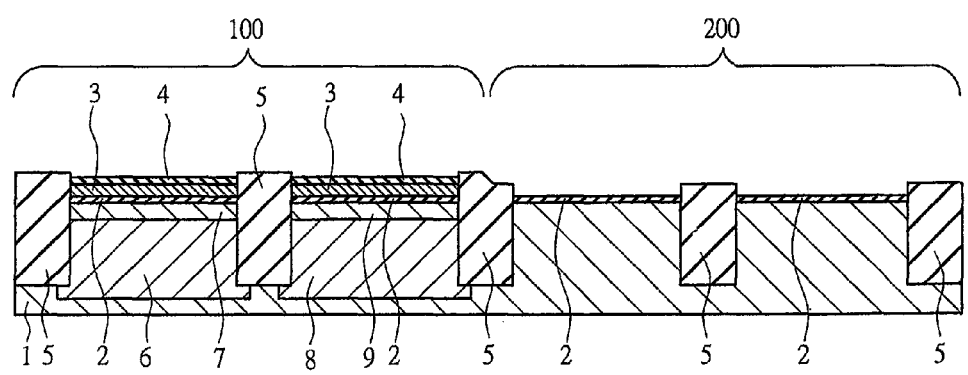
FIG. 8 is a cross-sectional view of main parts of the semiconductor substrate in a manufacturing step of the semiconductor device continued from FIG. 7.
Figure 9:
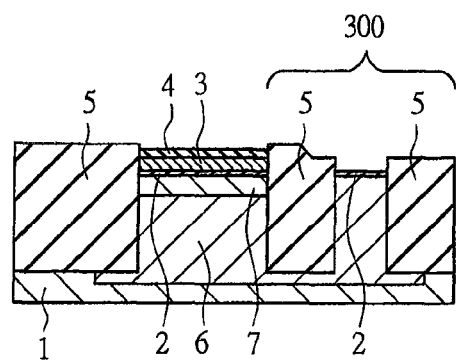
FIG. 9 is a cross-sectional view of main parts of the semiconductor substrate in a manufacturing step of the semiconductor device in the same step of FIG. 8.

Subsequently, as shown in FIGS. 8 and 9, the silicon oxide films 4 of the opened bulk region 200 and the back gate contact region 300 are removed by, for example, hydrofluoric acid cleaning. At this time, a part of the upper portion of the device isolation region 5 of the bulk region 200 made of the silicon oxide film is also scraped, and in the bulk region 200, the step between the silicon substrate 1 and the STI (device isolation region 5) can be adjusted, and moreover, the step on the STI generated in the photoresist boundary part can be made gentle. Next, for example, by the dry etching technology, with taking the buried insulating layer 2 as a stopper, the SOI layer 3 is selectively removed, and after that, the photoresist is removed.

After this, if needed, upon removal of the buried insulating layer 2 on the silicon substrate 1 by, for example, hydrofluoric acid cleaning, the surface of the silicon substrate 1 is oxidized to the extent of 10 nm by a thermal oxidation method, and by using a sacrificial oxidation method of removing the silicon oxide film thus formed, a damage layer introduced on the silicon substrate 1 may be removed by dry etching having the SOI layer 3 removed. After that, for example, a thin silicon oxide film to the extent of 10 nm is formed again on the silicon substrate 1 by a thermal oxidation method, thereby reproducing conditions similar to those of FIGS. 8 and 9.

In the bulk region 200 and the back gate contact region 300 thus formed through the above-described process, a step between the surface of the silicon substrate 1 and the surface of the SOI layer 3 of the SOI region 100 is small to the extent of 20 nm. This enables the SOI-MISFET and the bulk-MISFET to be formed by the same process in the deposition and processing of the polycrystalline silicon film, which later becomes a gate, and is effective for preventing unprocessed parts of the step portion and a gate disconnection.

Figure 10:
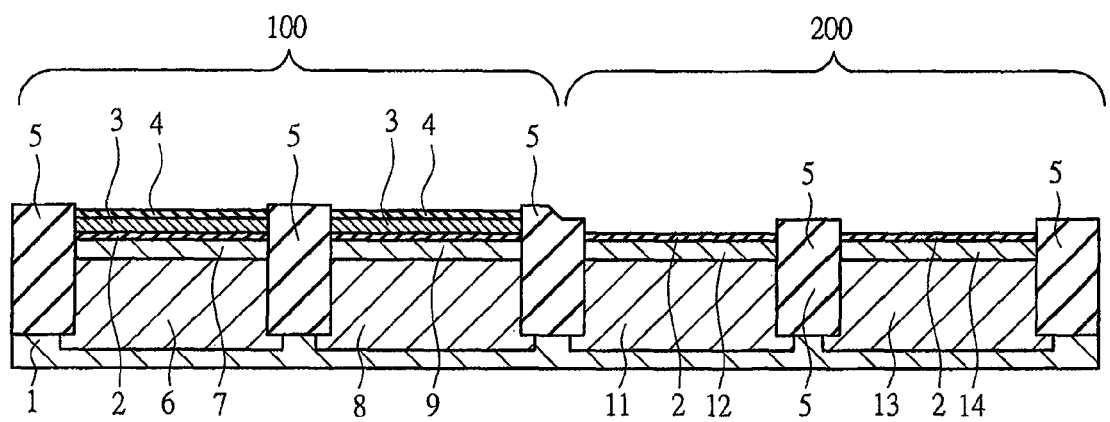
FIG. 10 is a cross-sectional view of main parts of the semiconductor substrate in a manufacturing step of the semiconductor device continued from FIG. 8 and FIG. 9.

Subsequently, as shown in FIG. 10, in the bulk region 200, a P-type well 11 and a threshold voltage control diffusion layer region 12 are selectively formed in the desired region of the silicon substrate 1 by a lithography technology and an ion implantation through the thin buried insulating layer 2. Subsequently, similarly, an N-type well 13 and a threshold voltage control diffusion layer region 14 are selectively formed in the desired region of the silicon substrate 1.

Figure 11:
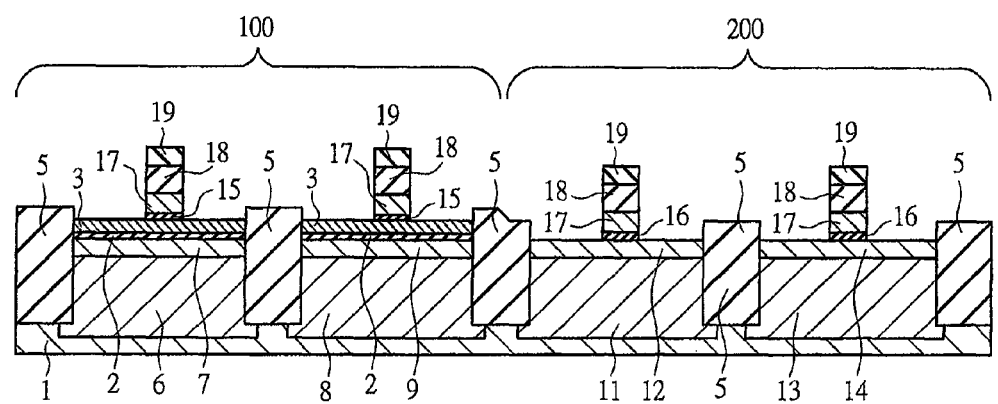
FIG. 11 is a cross-sectional view of main parts of the semiconductor substrate in a manufacturing step of the semiconductor device continued from FIG. 10.

Subsequently, as shown in FIG. 11, the gate insulator 15 of the SOI-MISFET is formed in the SOI region 100, and the gate insulator 16 of the bulk-MISFET is formed in the bulk region 200, and after that, for example, by a CVD method, a polycrystalline silicon film 17 having a thickness of 40 nm, a silicon oxide film 18 having a thickness of 50 nm, and a silicon nitride film 19 having a thickness of 30 nm are stacked in sequence, and by a lithography technology and anisotropic dry etching, a gate electrode and a gate protection film formed of the stacked film are formed.

Here, the gate insulator 15 of the SOI-MISFET in the SOI region 100 and the gate insulator 16 of the bulk-MISFET in the bulk region 200 are formed specifically as follows. First, the buried insulating layer 2 exposed on the surface of the bulk region 200 is removed, for example, by hydrofluoric acid cleaning so as to expose the surface of the silicon substrate 1. After that, for example, by the thermal oxidation method, a thermal oxide film of 7.5 nm is formed on the silicon substrate 1.

At this time, similarly, in the SOI region 100, the silicon oxide film 4 exposed on the surface is removed, and the thermal oxide film of 7.5 nm is formed on the SOI layer 3. This is selectively removed, for example, by a lithography technology and hydrofluoric acid cleaning, and a thermal oxide film of 1.9 nm is formed on the SOI layer 3, for example, by a thermal oxidation method.

The surfaces of these thermal oxide films of 7.5 nm and the thermal oxide film of 1.9 nm are nitrided by NO gas, thereby stacking and forming nitride films of 0.2 nm on the main surfaces, and the insulating film formed on the SOI layer 3 is taken as the gate insulator 15, and the insulating film formed on the silicon substrate 1 is taken as the gate insulator 16, respectively.

In this manner, the gate insulator 16 of the bulk-MISFET can be formed to be thicker than the gate insulator 15 of the SOI-MISFET. As a result, the breakdown voltage of the bulk-MISFET is made high so as to enable a high voltage operation.

Further, in the present embodiment, as described above, since the step between the SOI region 100 and the bulk region 200 is low to the extent of 20 nm, it is within an allowable range of focal depth upon the lithography, and both of the regions can be formed simultaneously. Further, upon lamination and processing of the polycrystalline silicon film having a thickness of 40 nm as a gate material film, even in the step to stretch to both of the regions, both of the regions can be formed without unprocessed parts and disconnection.

Figure 12:
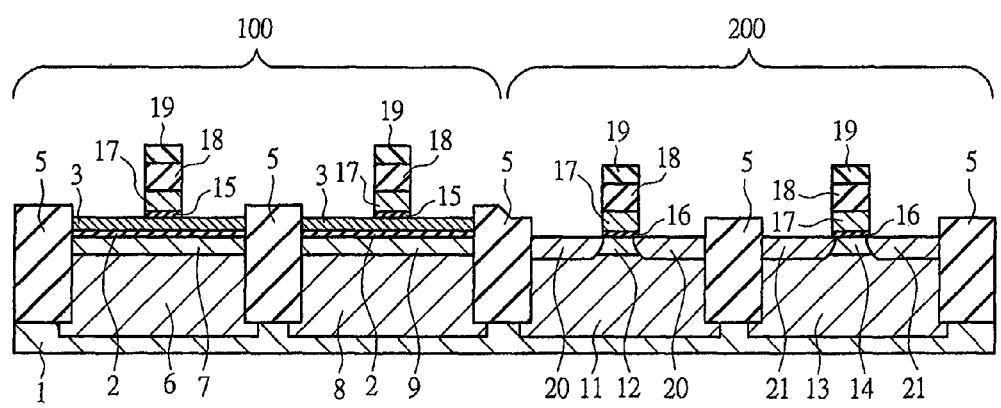
FIG. 12 is a cross-sectional view of main parts of the semiconductor substrate in a manufacturing step of the semiconductor device continued from FIG. 11.

Subsequently, by a lithography technology, for example, As (arsenic) ions are implanted for an N-type bulk-MISFET, and, for example, $BF_2$ ions are implanted for a P-type bulk-MISFET by an acceleration energy of 45 keV under conditions of implantation amounts of $3 \times 10^{13}/cm^2$ and $5 \times 10^{13}/cm^2$, respectively. At this time, by the silicon nitride film 19 and the silicon oxide film 18 serving as the gate protection films, the polycrystalline silicon film 17 serving as the gate electrode and the channel region below the gate are not implanted with an impurity, and the surface region of the silicon substrate 1 has formed thereto a shallow N-type diffusion layer (hereinafter, referred to as an extension layer) 20 and a shallow P-type diffusion layer (similarly, referred to as an extension layer) 21 in a self-aligned manner (FIG. 12). In this ion implantation, the SOI-MISFET is protected by the photoresist, so that an impurity is not implanted.

Figure 13:
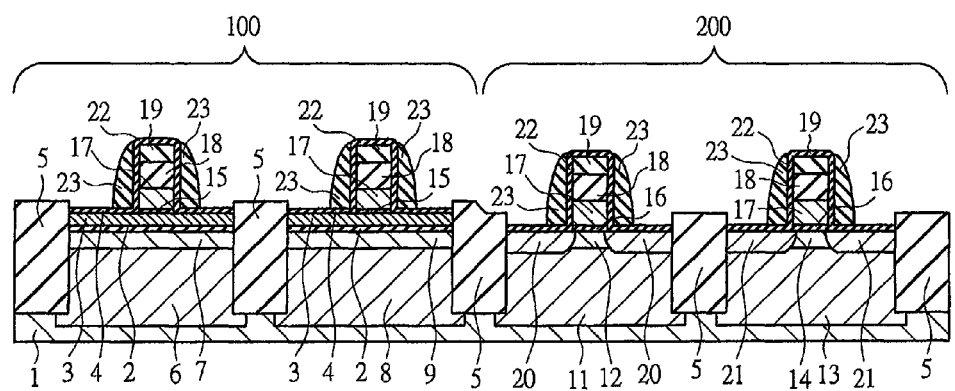
FIG. 13 is a cross-sectional view of main parts of the semiconductor substrate in a manufacturing step of the semiconductor device continued from FIG. 12.

Subsequently, as shown in FIG. 13, a silicon oxide film 22 having a thickness of 10 nm and a silicon nitride film a thickness of 40 nm are deposited in sequence by a CVD method, and the silicon nitride film is selectively subjected to anisotropic etching with taking the silicon oxide film 22 as a stopper so as to form a sidewall 23 made of the silicon nitride film (FIG. 13). In the present technique, since the thin SOI layer 3 is protected by the silicon oxide film 22, a reduction of the thickness due to dry etching and an introduction of damages can be prevented.

Figure 14:
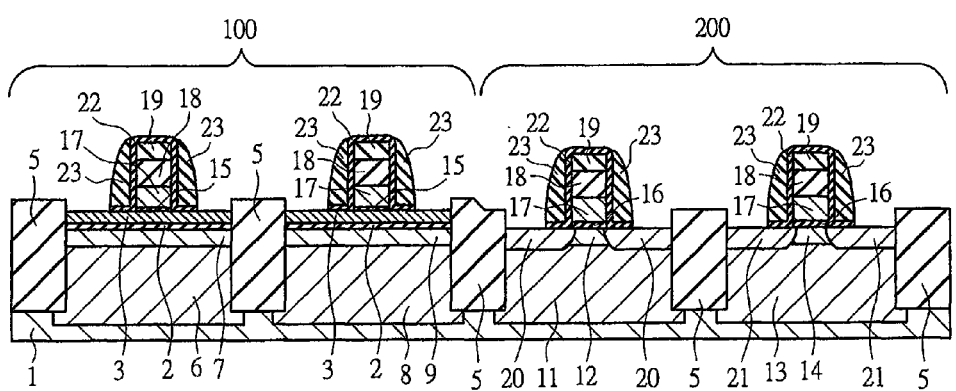
FIG. 14 is a cross-sectional view of main parts of the semiconductor substrate in a manufacturing step of the semiconductor device continued from FIG. 13.

Subsequently, for example, by hydrofluoric acid cleaning, the exposed silicon oxide film 22 is removed, and as shown in FIG. 14, the SOI layer 3 of the SOI-MISFET serving as the source and drain region, and the silicon substrate 1 of the bulk-MISFET are exposed. At this time, if needed, a CDE (Chemical Dry Etching) may be performed to remove a damage layers of the surfaces of the SOI layer 3 and the silicon substrate 1 introduced due to the ion implantation or the dry etching and the like.

Subsequently, by using a selective epitaxial growth method, an elevated single crystal layer formed of silicon or germanium is selectively formed on the exposed single crystal silicon (SOI layer 3, silicon substrate 1).

Figure 15:
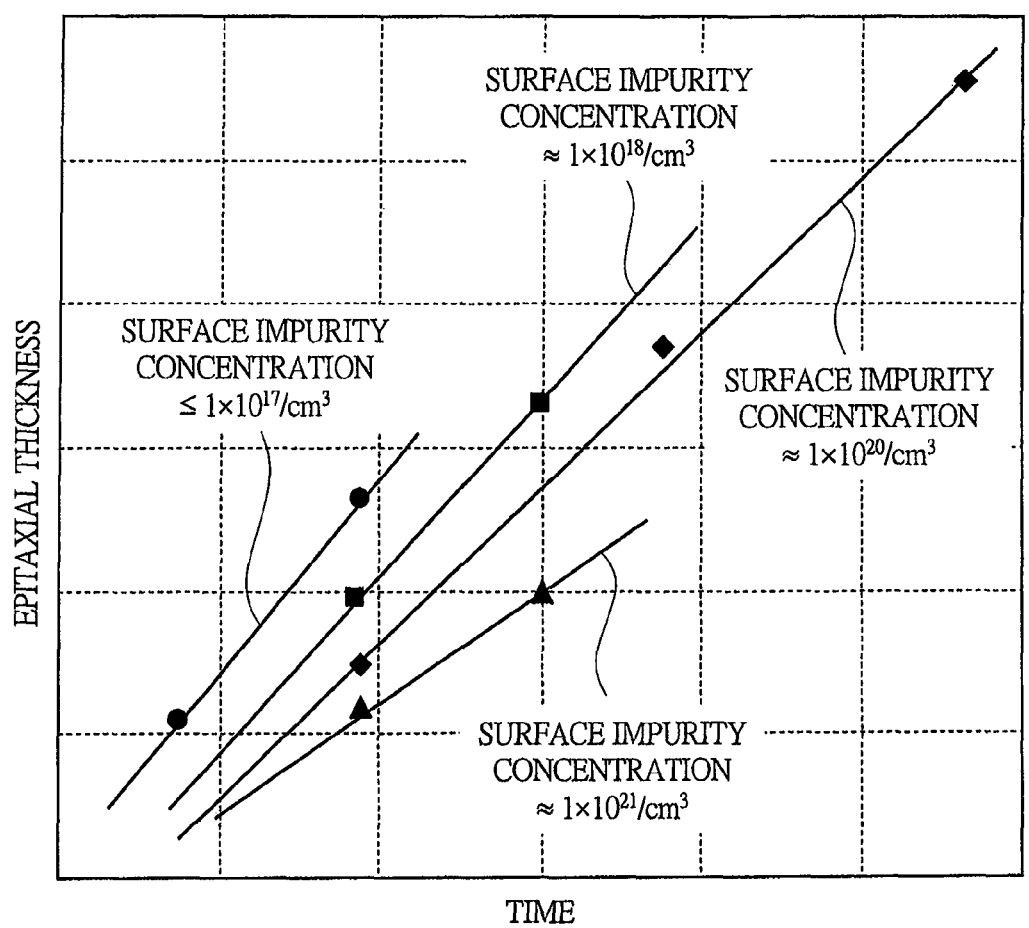
FIG. 15 is a diagram showing a thickness of an epitaxial film to be grown as expressed by a function of the growth time with respect to a state in which a concentration of an impurity contained in a single crystal silicon layer serving as a base varies in a selective epitaxial growth method.

In the selective epitaxial growth method, the inventors of the present invention have found out by experiments that the thickness of the single crystal semiconductor layer to be crystal-grown varies depending on the concentration of the impurity contained in the signal crystal silicon serving as a base. As shown in FIG. 15, it is clear that, in relation to the growth time, the denser the impurity density contained in the silicon layer serving as the base is, the thinner the thickness of the epitaxial film to be grown becomes.

Figure 16:
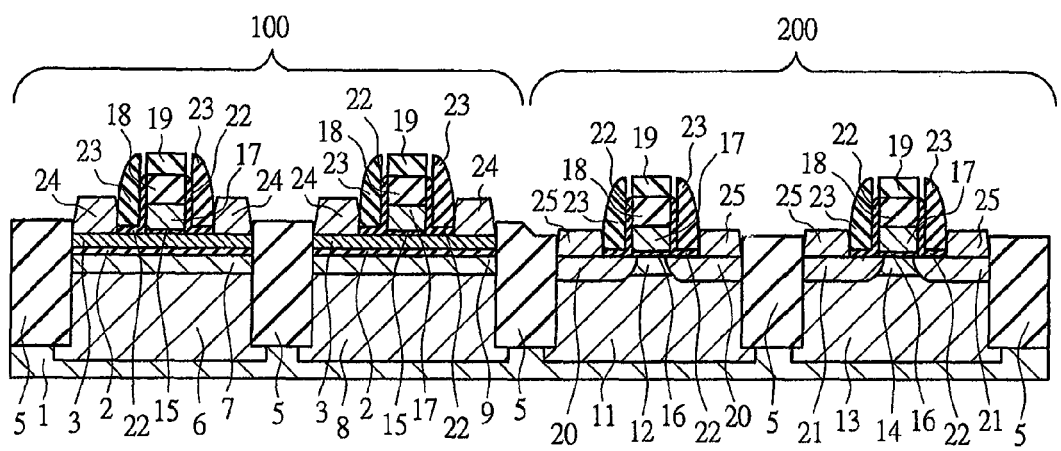
FIG. 16 is a cross-sectional view of main parts of the semiconductor substrate in a manufacturing step of the semiconductor device continued from FIG. 14.

Accordingly, a feature of the present embodiment is to form the impurity concentration of the SOI layer 3 serving as the base in the SOI-MISFET low at the time of performing the selective epitaxial growth by the extension layers 20 and 21 serving as the bases in the bulk-MISFET. As a result, as shown in FIG. 16, the thickness of the elevated layer 24 of the SOI-MISFET can be formed thicker than that of the elevated layer 25 of the bulk-MISFET by a single epitaxial growth according to the dependency of the epitaxial film thickness on the impurity concentration of the single crystal silicon layer serving as the base.

For example, the elevated layer 24 having a thickness of 50 nm is formed for the SOI-MISFET, and the elevated layer 25 having a thickness of 30 nm is formed for the bulk-MISFET. Here, the elevated layer 24 of the SOI-MISFET is required to be formed higher than the polycrystalline silicon film 17 serving as a gate so that the silicide layer does not reach the buried insulating layer 2 in the later silicide process.

Figure 17:
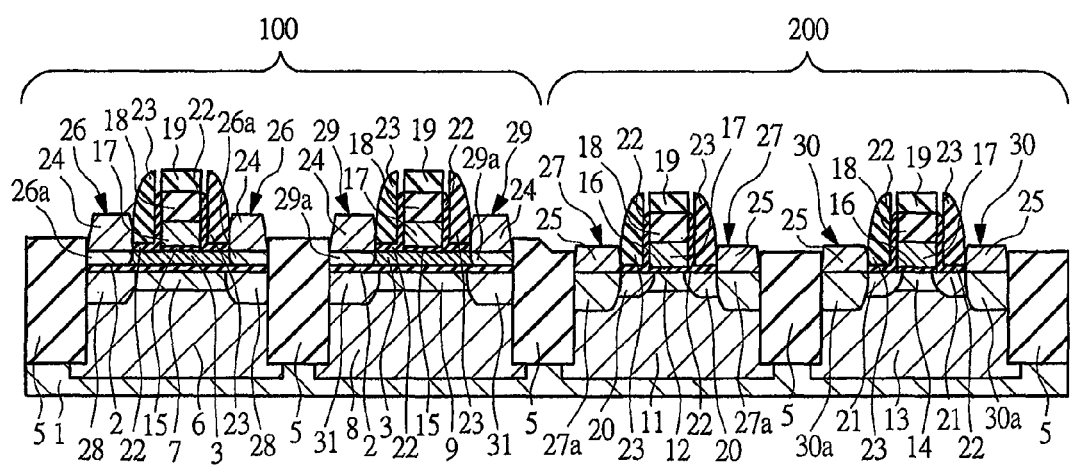
FIG. 17 is a cross-sectional view of main parts of the semiconductor substrate in a manufacturing step of the semiconductor device continued from FIG. 16.

Subsequently, by using a lithography technology, the N-type SOI-MISFET and the N-type bulk-MISFET are implanted with, for example, As ions by an acceleration energy of 11 keV under the conditions of the implantation amount of $4 \times 10^{15}/cm^2$. At this time, by the silicon nitride film 19 and the silicon oxide film 18 serving as the gate protection films, the polycrystalline silicon film 17 serving as the gate electrode and the channel region below the gate are not implanted with the impurities, and a N-type diffusion layer 26 of the SOI-MISFET and an N-type diffusion layer 27 of the bulk-MISFET are formed in a self-alignment manner (FIG. 17). That is, in the N-type SOI-MISFET, the elevated layer 24 and the SOI layer 3 therebelow are implanted with the impurities, so that the N-type diffusion layer 26 constituting the source and drain is formed. At this time, the region of the SOI layer 3 constituting the N-type diffusion layer 26 is formed as the semiconductor region 26a. Similarly, in the N-type bulk-MISFET, the elevated layer 25 and the silicon substrate 1 therebelow are implanted with the impurities, so that the N-type diffusion layer 27 constituting the source and drain is formed. At this time, the region of the silicon substrate 1 constituting the N-type diffusion layer 27 is formed as the semiconductor region 27a.

Further, by additionally implanting, for example, P ions by an acceleration energy of 12 keV under the conditions of an implantation amount of $5 \times 10^{14}/cm^2$, even inside the silicon substrate 1 below the buried insulating layer 2 in the SOI-MISFET, a diffusion layer impurity compensation region 28 of the SOI-MISFET may be formed. This aims to reduce the junction capacitance of the source and drain diffusion layer, and is provided for the purpose that the threshold voltage control diffusion layer region 7 previously implanted is compensated by implanting ions of an opposite conductivity type, and an impurity compensation region is made near to an intrinsic impurity region.

The above described ion implantation can be performed to the SOI-MISFET and the bulk-MISFET by a common process with adjusting implantation conditions to simplify the process.

Subsequently, for the P-type SOI-MISFET and bulk-MISFET also, similarly to the foregoing, the P-type diffusion layer 29 of the SOI-MISFET and the P-type diffusion layer 30 of the bulk-MISFET and a diffusion layer impurity compensation region 31 of the SOI-MISFET are formed (FIG. 17). That is, in the P-type SOI-MISFET, the elevated layer 24 and the SOI layer 3 therebelow are implanted with the impurity, so that the P-type diffusion layer 29 constituting the source and drain is formed. At this time, the region of the SOI layer 3 constituting the P-type diffusion layer 29 is formed as the semiconductor region 29a. Similarly, in the P-type bulk-MISFET, the elevated layer 25 and the silicon substrate 1 therebelow are implanted with the impurities, so that the P-type diffusion layer 30 constituting the source and drain is formed. At this time, the region of the silicon substrate 1 constituting the P-type diffusion layer 30 is formed as the semiconductor region 30a.

Figure 18:
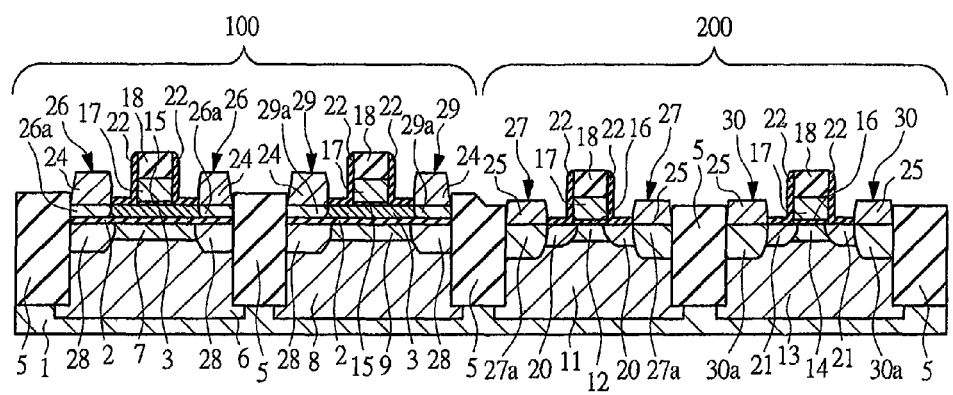
FIG. 18 is a cross-sectional view of main parts of the semiconductor substrate in a manufacturing step of the semiconductor device continued from FIG. 17.

Subsequently, for example, by hot phosphoric acid cleaning, the sidewall 23 formed of the silicon nitride film and the silicon nitride film 19 of the gate protection film are selectively removed (FIG. 18).

Figure 19:
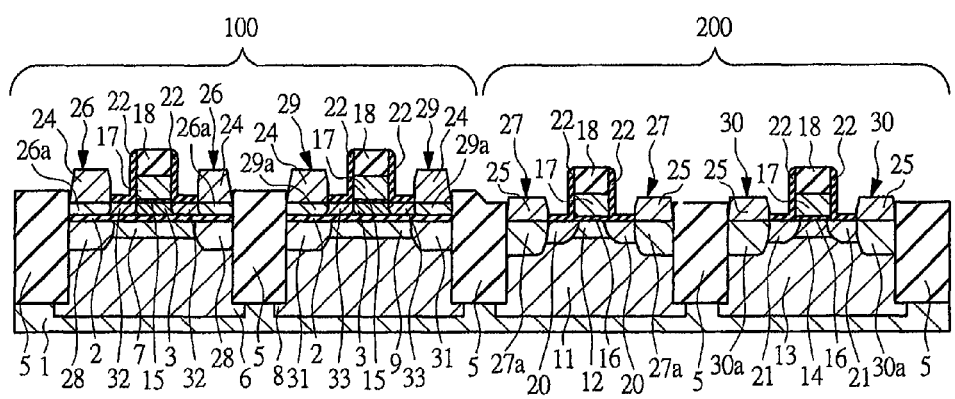
FIG. 19 is a cross-sectional view of main parts of the semiconductor substrate in a manufacturing step of the semiconductor device continued from FIG. 18.

Subsequently, as shown in FIG. 19, by using a lithography technology, the N-type SOI-MISFET is implanted with, for example, As ions under the conditions of an acceleration energy of 4 keV and an implantation amount of $5 \times 10^{15}/cm^2$. At this time, by the silicon oxide film 18 serving as the gate protection film, the polycrystalline silicon film 17 serving as the gate electrode and the channel region below the gate are not implanted with the impurities, and the N-type extension layer 32 is formed in a self-alignment manner.

Similarly, the P-type SOI-MISFET is implanted with, for example, B (boron) ions under the conditions of acceleration energy of 2 keV and the implantation amount of $5 \times 10^{14}/cm^2$, thereby forming the P-type extension layer 33.

Subsequently, for example, by a RTA (Rapid Thermal Anneal) of 1050° C. in the nitrogen atmosphere, the implanted impurity is activated and diffused, thereby controlling the distance between the extension layers 32 and 33 and the gate.

At this time, the silicon oxide film 22 of the gate sidewall deposited in advance can play a role of as an offset spacer for controlling the distance between the extension layers 32 and 33 and the gate at the time of the ion implantation.

Further, in the present embodiment, since it is possible to reduce a thermal load after forming the extension layers 32 and 33, the expansion of the extension layers due to thermal diffusion can be prevented, and the layers can be formed with high controllability.

Further, even when the extension layers 32 and 33 are amorphized by the ion implantation with a high concentration, the implanted ions of the present process do not reach the channel region directly below the gate at the sides and the semiconductor region 26a or 29a, and thus the regions are single crystal layers. Therefore, with these regions taken as seed layers, the extension layers can be amorphized and it becomes possible to prevent an increase of the external resistance.

Figure 20:
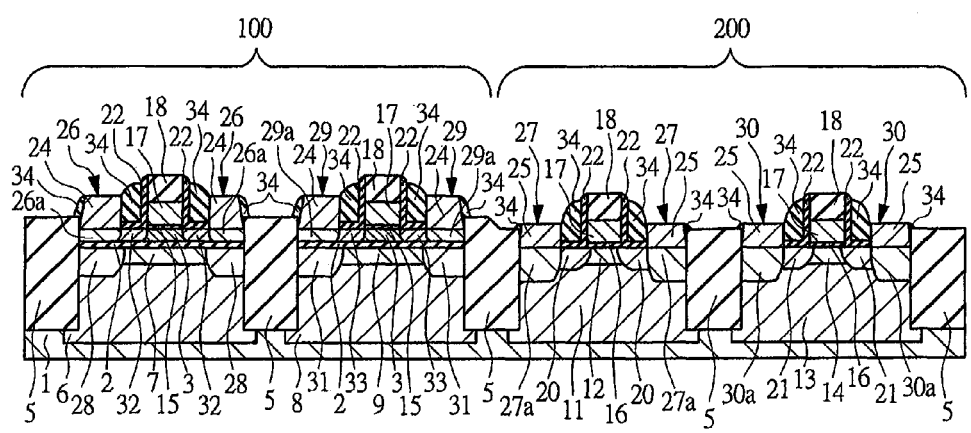
FIG. 20 is a cross-sectional view of main parts of the semiconductor substrate in a manufacturing step of the semiconductor device continued from FIG. 19.

Subsequently, as shown in FIG. 20, a silicon nitride film having a thickness of 40 nm is deposited on the whole surface of the SOI substrate, and the SOI substrate is subjected to the anisotropic etching, thereby forming the sidewall 34 formed of the silicon nitride film at the gate side. At this time, the sidewall 34 is also formed between the elevated layers 24 and 25 and the device isolation region 5. The sidewall 34 plays a role of preventing formation of an excessive silicide layer in the later silicide process due to Ni (nickel) deposited on the STI diffusing up to the elevated layer.

Figure 21:
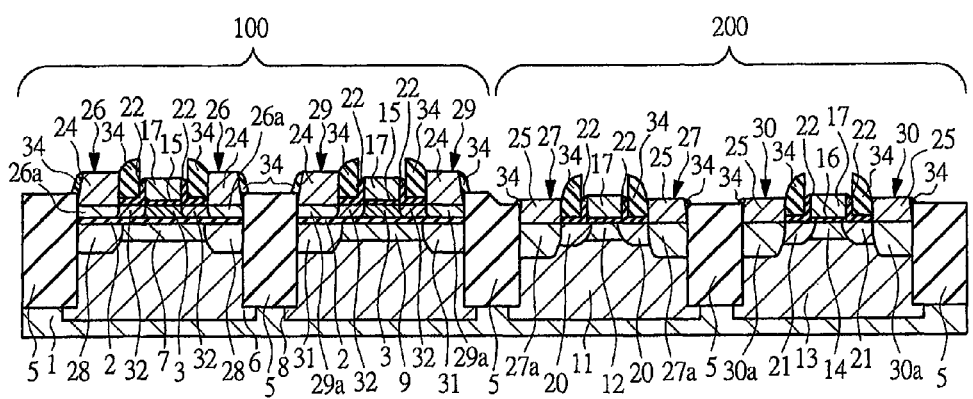
FIG. 21 is a cross-sectional view of main parts of the semiconductor substrate in a manufacturing step of the semiconductor device continued from FIG. 20.

Subsequently, the silicon oxide film 18 of the gate protection film is selectively removed by, for example, hydrofluoric acid cleaning to expose the polycrystalline silicon film 17 serving as the gate (FIG. 21).

Figure 22:
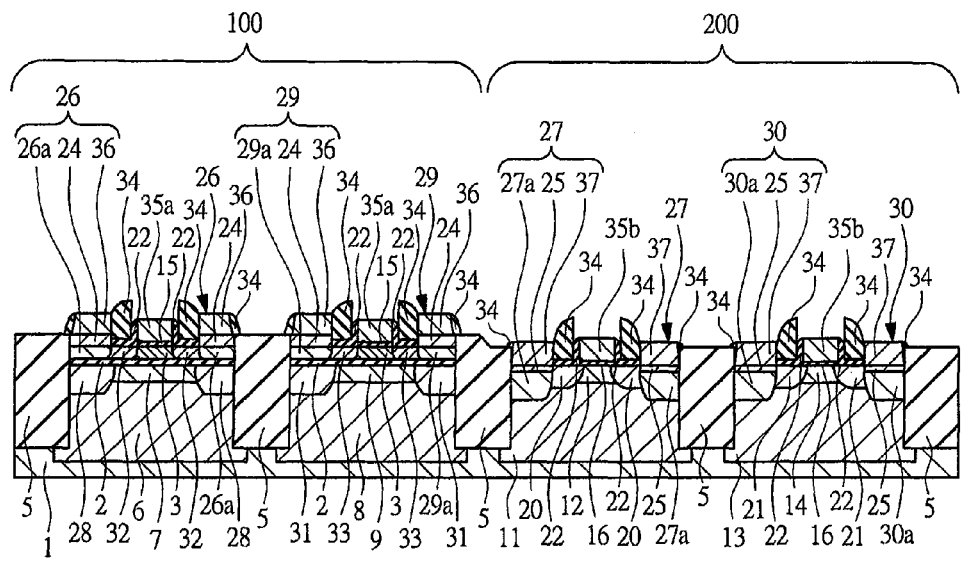
FIG. 22 is a cross-sectional view of main parts of the semiconductor substrate in a manufacturing step of the semiconductor device continued from FIG. 21.

Subsequently, for example, by a sputtering method, a metal film, e.g., a Ni film having a thickness of 20 nm is adhered (deposited) on the whole surface of the SOI substrate, and is reacted with silicon by thermal treatment of 320° C., so as to form a silicide layer. Subsequently, the unreacted Ni film is removed by, for example, a mixed aqueous solution of hydrochloric acid and hydrogen peroxide water, and then, a thermal treatment of 550° C. is added to control a phase of the silicide layer. As a result, the whole region of the gate electrode formed of the exposed polycrystalline silicon film 17 and at least upper regions of the N-type and the P-type high density diffusion layers 26, 27, 29, and 30 are formed of silicide layers, and the full-silicided gate electrodes 35a and 35b and the silicide layers 36 and 37 are formed (FIG. 22).

In the above described silicidation process, the polycrystalline silicon film 17 without the impurity is converted into the silicide layers (gate electrode 35a and 35b) until the regions contacting the gate insulators 15 and 16, so that the desired threshold voltage value of the MISFET is realized by the lowered resistance of the gate wiring and the work function of the silicide layer. Further, the gate depletion causing a problem in the polycrystalline silicon gate electrode can be suppressed.

In the SOI-MISFET, as described with reference to FIG. 16, since the elevated layer 24 is formed higher than the gate electrode 35a, the lower boundary surface of the silicide layer 36 of the upper part of the diffusion layers 26 and 29 constituting the source and drain is located higher than the boundary surface of the gate electrode 35a and the gate insulator 15. That is, the silicide layer 36 is formed so as not to reach the buried insulating layer 2, and a low contact resistance can be realized without reducing the contact area with the silicide layer 36 and the diffusion layers 26 and 29. Further, in the thermal treatment of the silicide layer formation, it is possible to prevent an abnormal diffusion of the silicide layer toward the channel region below the gate that may occur after the silicide layer reaches the buried insulating layer 2.

On the other hand, in the bulk-MISFET, as described with reference to FIG. 16, since the elevated layer 25 is formed lower than that of the SOI-MISFET, the lower boundary surface of the silicide layer 37 may be formed inside the silicon substrate 1. At this time, since the boundary areas of the silicide layer 37 and the diffusion layers 27 and 30 are increased, the contact resistance can be further reduced.

Figure 23:
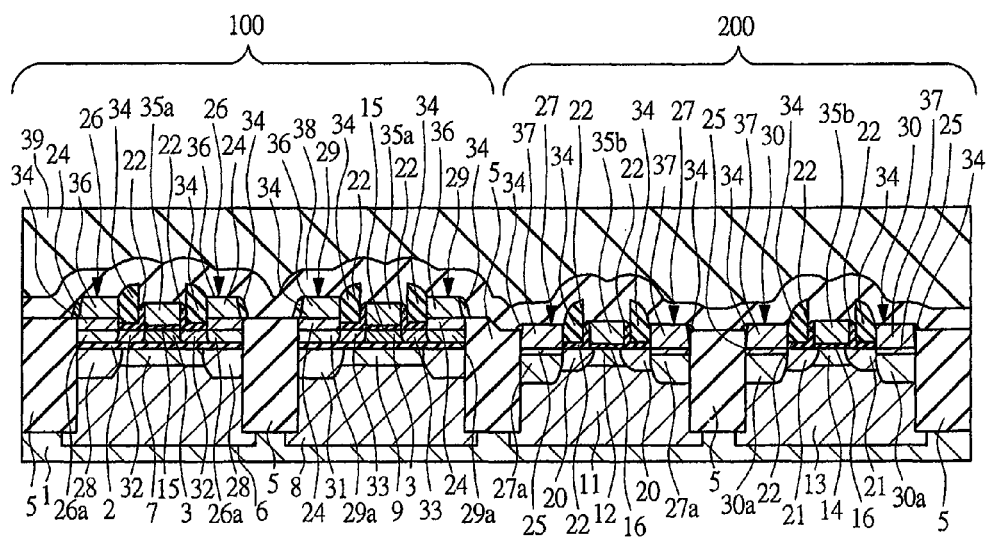
FIG. 23 is a cross-sectional view of main parts of the semiconductor substrate in a manufacturing step of the semiconductor device continued from FIG. 22.

Subsequently, as shown in FIG. 23, deposition and planarization of a CESL (Contact Etch Stopper Layer) 38 formed of a silicon nitride film, and an inter-layer insulating film 39 formed of a silicon oxide film are performed.

Subsequently, by forming a contact hole reaching the gate, the back gate, and the source and drain, the semiconductor device structure shown in FIG. 1 to FIG. 3 is completed. After that, though illustration is omitted, by processing through a wiring process including deposition and patterning of a metal film, and deposition and planarization, polishing, and the like of an insulating film between wirings, the semiconductor device is substantially completed.

Second Embodiment

Figure 24:
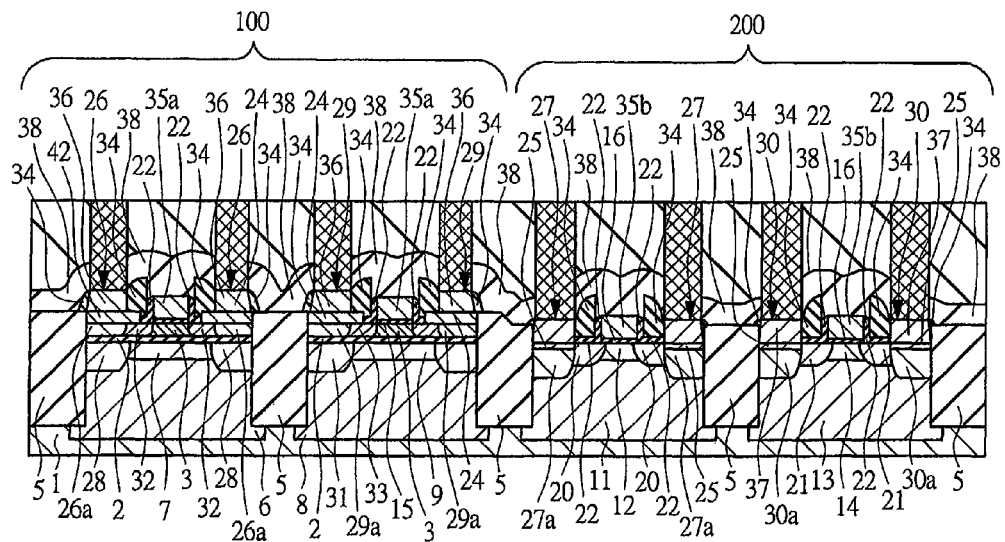
FIG. 24 is a cross-sectional view of main parts of a semiconductor device according to another embodiment of the present invention.

A plan view of main parts of a semiconductor device according to a second embodiment of the present invention is, for example, FIG. 1, and a cross-sectional view of main parts of a semiconductor substrate taken along the line A-A' of FIG. 1 at this time is FIG. 24.

While the elevated layers of the SOI-MISFET and the bulk-MISFET have been formed by the single selective epitaxial growth process in the first embodiment, in the second embodiment, the selective epitaxial growth process is performed twice, thereby forming first and second elevated layers for the SOI-MISFET and the bulk-MISFET, respectively. This point is different from the first embodiment.

In the SOI-MISFET according to the second embodiment, a first elevated layer (lowermost layer) 42 is formed directly below the sidewalls 34 at both sides of the gate. Hence, the diffusion layers 26 and 29 are provided such that the two layers have a distance from the gate electrode 35a, the uppermost elevated layers 24 have more distance than the lowermost layers 42 in proportion. Since this first elevated layer 42 becomes a conductive region in addition to the SOI layer 3, the external resistance of the SOI-MISFET can be further reduced, so that the device for higher driving current can be realized. Further, by forming the thickness of this first elevated layer 42 thin, the deterioration of the high speed of the device due to an increase in parasitic capacitance between the layer and the gate electrode 35a can be prevented.

Next, an example of a manufacturing method of the semiconductor device in the present embodiment configured as described above will be described according to the steps in sequence by using the drawings. For convenience of description, though a semiconductor substrate and a conductive type of the semiconductor film will be described being fixed, a combination of the conductive types may be arbitrary, and is not limited to the conductive type described in the present embodiment.

Figure 25:
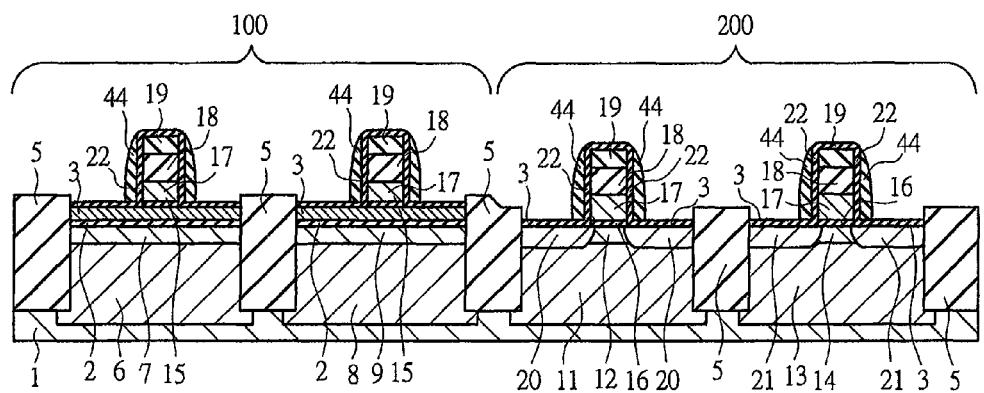
FIG. 25 is a cross-sectional view of main parts of a semiconductor substrate in a manufacturing step of the semiconductor device of the another embodiment of the present invention.

Formation of the gate is performed basically in conformity with the first embodiment (FIG. 12), and after that, as shown in FIG. 25, the silicon oxide film 22 having a thickness of 10 nm and a silicon nitride film having a thickness of 10 nm are deposited in sequence, for example, by a CVD method, and with the silicon oxide film 22 taken as a stopper, the silicon nitride film is selectively subjected to anisotropic etching, thereby forming a thin spacer layer 44 formed of the silicon nitride film.

Figure 26:
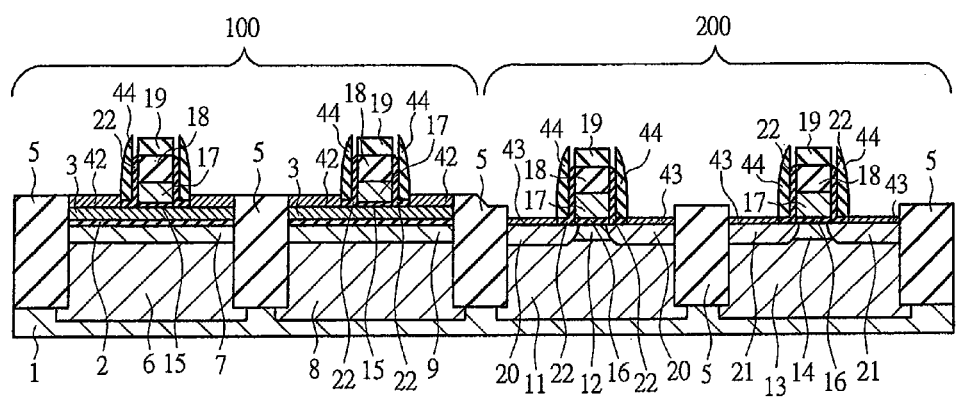
FIG. 26 is a cross-sectional view of main parts of the semiconductor substrate in a manufacturing step of the semiconductor device continued from FIG. 25.

Subsequently, as shown in FIG. 26, similarly to the first embodiment, the elevated layer is formed by a selective epitaxial growth method. But, in the present embodiment, the growth time is made short, and for example, the thin first stage elevated layer (lowermost layer) 42 having a thickness of 10 nm is formed in the SOI-MISFET, and the thin first stage elevated layer (lowermost layer) 43 having a thickness of 6 nm is formed in the bulk-MISFET.

Figure 27:
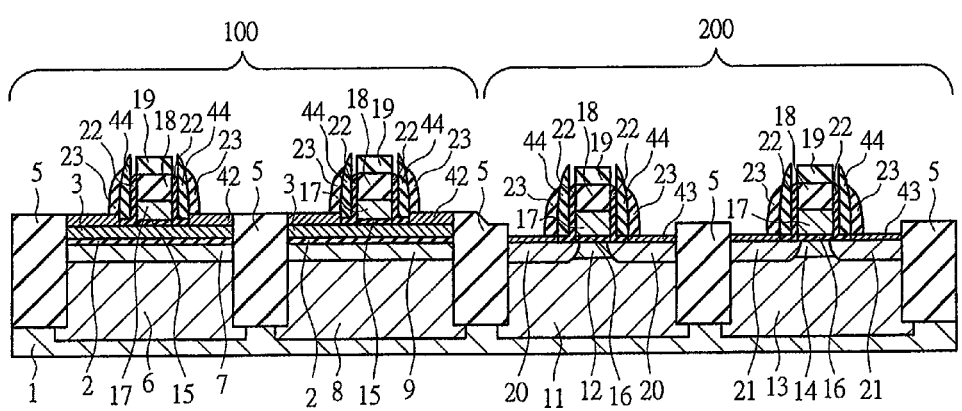
FIG. 27 is a cross-sectional view of main parts of the semiconductor substrate in a manufacturing step of the semiconductor device continued from FIG. 26.

Subsequently, as shown in FIG. 27, for example, by a CVD method, the silicon nitride film having a thickness of 30 nm is deposited, and is subjected to anisotropic etching, thereby forming the sidewall 23 formed of the silicon nitride film. At this time, in the SOI-MISFET, the first stage elevated layer 42 is formed on the SOI layer 3, and the thickness up to the buried insulating layer 2 is increased, and therefore, contrary to the first embodiment, the deposition of the silicon nitride film serving as a stopper may be omitted.

Figure 28:
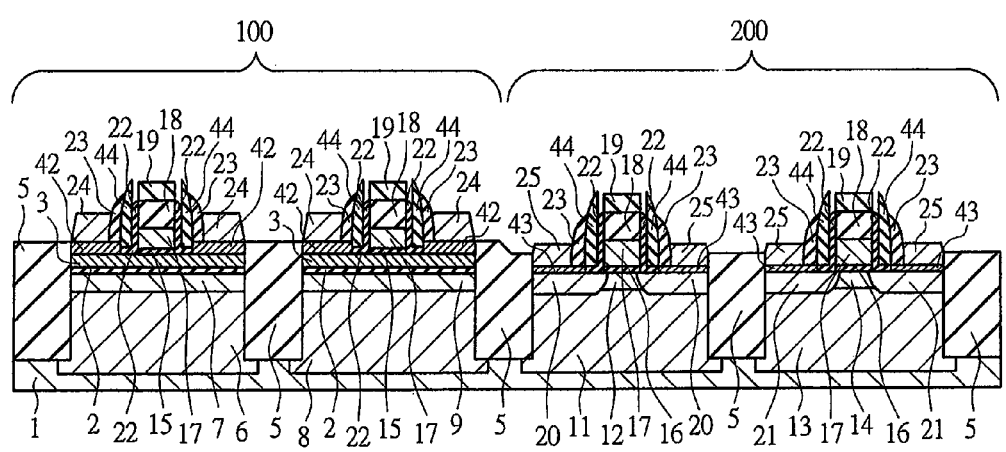
FIG. 28 is a cross-sectional view of main parts of the semiconductor substrate in a manufacturing step of the semiconductor device continued from FIG. 27.

Subsequently, as shown in FIG. 28, similarly to the first embodiment, by the selective epitaxial growth method, the elevated layers 24 and 25 serving as the upper layers are formed. At this time, the semiconductor single crystal layer serving as the base of the growth becomes the first stage elevated layers 42 and 43. Consequently, the impurity concentration contained in the first stage elevated layers 42 and 43 is adjusted by, for example, ion implantation. Thus, based on the dependency of the growth film thickness on the impurity concentration shown in FIG. 15, the grown film thickness in the present process can be controlled anew.

After that, by going through the same process as the process described with reference to FIGS. 17 to 23 of the first embodiment, the semiconductor device shown in FIG. 24 is substantially completed.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, while descriptions have been made on the case where the SOI-MISFET and the bulk-MISFET are mounted together in the above-described embodiments, this can be also applied to the case where, for example, the pair may be SOI-MISFETs themselves or bulk-MISFETs themselves. That is, for example, the elevated layers can be provided having different heights and the impurity concentrations can be different between SOI-MISFETs.

The present invention can be widely used for manufacturing industries for manufacturing semiconductor devices.

What is claimed is:

1. A method of manufacturing a semiconductor device comprising the steps of:
    (a) preparing a substrate that includes:
    a semiconductor substrate having a first region in which a first MISFET is formed and a second region in which a second MISFET is formed, an insulating layer formed on the semiconductor substrate and a semiconductor layer formed on the insulating layer;
    (b) removing the semiconductor layer and the insulating layer in the second region to expose the semiconductor substrate in the second region;
    (c) forming a first gate electrode and a first gate insulator on the semiconductor layer in the first region with the first gate insulator interposed between the first gate electrode and the semiconductor layer;
    (d) forming a second gate electrode and a second gate insulator on the semiconductor substrate in the second region with the second gate insulator interposed between the second gate electrode and the semiconductor substrate;
    (e) after steps (c) and (d), forming second extension regions of the second MISFET in the semiconductor substrate of the second region;
    (f) after step (e), forming first sidewall spacers over side walls of the first gate electrode and over side walls of the second gate electrode;
    (g) after step (f), forming first elevated layers over the semiconductor layer of the first region and over the side walls of the first gate electrode via the first sidewall spacers;
    (h) after step (f), forming second elevated layers over the semiconductor substrate of the second region and over the side walls of the second gate electrode via the first sidewall spacers;
    (i) after step (h), removing the first sidewall spacers;
    (j) after step (i), forming first extension regions of the first MISFET in the semiconductor layer of the first region;
    (k) after step (j), forming second sidewall spacers over the side walls of the first gate electrode and over the side walls of the second gate electrode;
    wherein a thickness of the first elevated layers is greater than a thickness of the second elevated layers.

2. A method of manufacturing a semiconductor device according to claim 1,
    wherein the first MISFET and the second MISFET are N-type MISFETS.

3. A method of manufacturing a semiconductor device according to claim 1,
    wherein the first MISFET and the second MISFET are P-type MISFETs.

4. A method of manufacturing a semiconductor device according to claim 1,
    wherein the first elevated layers and the second elevated layers are formed by an epitaxial growth method.

5. A method of manufacturing a semiconductor device according to claim 4,
    wherein steps (g) and (h) are performed simultaneously.

6. A method of manufacturing a semiconductor device according to claim 5, further comprising the step of:
    (l) after step (k), forming silicide layers over the first gate electrode, over the second gate electrode, over the first elevated layers and over the second elevated layers.

7. A method of manufacturing a semiconductor device according to claim 1,
    wherein the first sidewall spacers include a silicon nitride film.

8. A method of manufacturing a semiconductor device according to claim 1,
    wherein the second sidewall spacers include a silicon nitride film.

* * * * *